US009722121B2

(12) United States Patent
Kuznicki et al.

(10) Patent No.: US 9,722,121 B2
(45) Date of Patent: Aug. 1, 2017

(54) NANOSTRUCTURED UNITS FORMED INSIDE A SILICON MATERIAL AND THE MANUFACTURING PROCESS TO PERFORM THEM THEREIN

(71) Applicant: SEGTON ADVANCED TECHNOLOGY SAS, Versailles (FR)

(72) Inventors: Zbigniew Kuznicki, Hoenheim (FR); Patrick Meyrueis, Strasbourg (FR)

(73) Assignee: SEGTON ADVANCED TECHNOLOGY, Versailles (FR)

( * ) Notice: Subject to any disclaimer, the term of this patent is extended or adjusted under 35 U.S.C. 154(b) by 0 days.

(21) Appl. No.: 14/890,603

(22) PCT Filed: May 13, 2014

(86) PCT No.: PCT/IB2014/001973
§ 371 (c)(1),
(2) Date: Nov. 12, 2015

(87) PCT Pub. No.: WO2014/203080
PCT Pub. Date: Dec. 24, 2014

(65) Prior Publication Data
US 2016/0099368 A1  Apr. 7, 2016

Related U.S. Application Data

(60) Provisional application No. 61/855,343, filed on May 14, 2013.

(51) Int. Cl.
*H01L 21/00* (2006.01)
*H01L 31/065* (2012.01)
(Continued)

(52) U.S. Cl.
CPC ........ *H01L 31/065* (2013.01); *H01L 31/0288* (2013.01); *H01L 31/036* (2013.01);
(Continued)

(58) Field of Classification Search
None
See application file for complete search history.

(56) References Cited

U.S. PATENT DOCUMENTS

| 2011/0162700 A1* | 7/2011 | Kuznicki | .............. H01L 31/068 |
| | | | 136/255 |
| 2013/0340819 A1* | 12/2013 | Kuznicki | .............. H01L 31/028 |
| | | | 136/255 |
| 2016/0155869 A1* | 6/2016 | Kuznicki | ............ H01L 31/0288 |
| | | | 257/53 |

FOREIGN PATENT DOCUMENTS

| WO | WO 2010/089624 | 8/2010 |
| WO | WO 2012/131496 | 10/2012 |

* cited by examiner

*Primary Examiner* — Shaun Campbell
(74) *Attorney, Agent, or Firm* — Law Offices of Steven W. Weinrieb (57) ABSTRACT

The invention bears on elementary nanoscale units nanostructured-formed inside a silicon material and the manufacturing process to implement them. Each elementary nanoscale unit is created by means of a limited displacement of two Si atoms outside a crystal elementary unit. A localized nanoscale transformation of the crystalline matter gets an unusual functionality by focusing in it a specific physical effect as is a highly useful additional set of electron energy levels that is optimized for the solar spectrum conversion to electricity. An adjusted energy set allows a low-energy secondary electron generation in a semiconductor, preferentially silicon, material for use especially in very-high efficiency all-silicon light-to-electricity converters. The manufacturing process to create such transformations in a semiconductor material bases on a local energy deposition like ion implantation or electron (γ,X) beam irradiation and suitable thermal treatment and is industrially easily available.

34 Claims, 7 Drawing Sheets

View without carrier accumulation (51) Int. Cl.
  *H01L 31/036* (2006.01)
  *H01L 31/0288* (2006.01)
  *H01L 31/0352* (2006.01)
  *H01L 31/068* (2012.01)
  *H01L 31/18* (2006.01)
  *H01L 31/20* (2006.01)
  *H01L 31/0368* (2006.01)
  *H01L 31/0376* (2006.01)

(52) U.S. Cl.
  CPC .... *H01L 31/0352* (2013.01); *H01L 31/03682* (2013.01); *H01L 31/03762* (2013.01); *H01L 31/035236* (2013.01); *H01L 31/068* (2013.01); *H01L 31/1804* (2013.01); *H01L 31/1864* (2013.01); *H01L 31/202* (2013.01); *Y02E 10/547* (2013.01); *Y02P 70/521* (2015.11)

View without carrier accumulation

FIG. 8

View with carrier accumulation

Example a process step by step

| # | operation | description |
|---|---|---|
| 1 | c-Si | crystalline silicon wafer |
| 2a | c-Si (p-type) | homogeneous – light or moderate – p-type doping |
| 2b | c-Si (p-type) | rear p-type doping creating a BSF |

FIG. 13b

| 3 | c-Si (n-type) / c-Si (p-type) | heavy nonlinear n-type doping by diffusion from a surface source; creation of a generator internal membrane as PN junction |
|---|---|---|
| 4 | c-Si (n-type) / c-Si (p-type) | surface conditioning before implantation sequence |
| 5 | a*-Si (n-type) / c-Si (p-type) | amorphizing ion beam implantation through a mask that creates a buried substructure (a*-Si) |
| 6 | a**-Si (n-type) / c-Si (p-type) | solid-state epitaxy resulting from an annealing cycle (a**-Si) |
| 7 | <c-Si> nano layers / c-Si (p-type) | segton conditioning within the seg-matter |
| 8 | c-Si (p-type) | electronic passivation; metallization; light trapping |

NANOSTRUCTURED UNITS FORMED INSIDE A SILICON MATERIAL AND THE MANUFACTURING PROCESS TO PERFORM THEM THEREIN

This invention is a nanoscale unit for a low-energy secondary electron generation in a silicon material for use especially in all-silicon light-to-electricity converters and the manufacturing process to create them in such a material.

More particularly the process is a nanoscale transformation of the crystalline matter inside an elemental crystal unit, to get an unusual functionality by focusing in it a specific physical effect as is a highly useful additional set of electron energy levels that is optimized for the solar spectrum conversion to electricity.

1. PROBLEM SOLVED AND FIELD OF THE INVENTION

A. Problem

The adjustment of the light-to-electricity converter to the solar spectrum is complicated by on the one hand, the quantum mechanical operation being efficient or optimal in a very narrow spectral sub-range very close to the band gap and on the other hand, by the wide spread of the solar spectrum which is too large for efficient operation using single junction device.

Two ways are possible:

by conserving the same fundamental single mechanism of the photon-electron interaction that is exploited with the most efficiently way in the tandem cells; the progress is supported by the research of new materials, or suitable superposition of different materials as, for example, those from, for example the GaAs family. The conversion basis in this case on the single light-matter interaction determined by the absorption; one of the most complicated problems concerns, in this case, the current collection from different elements forming the converter;

by introducing multiple additional mechanisms that are possible due to nanoscale material transformations such as, for example, low-energy secondary electron generation with its several coupled mechanisms allowing the specific functional separation and localization and requiring the specific electron transport and specific carrier collection.

B. Field of Application

The invention relates to a method for improving the secondary low-energy generation and resulting multiplication cycle of collectable additional carriers in the light-to-electricity converter in general and particularly in the all-silicon converters of the solar radiation due to sub-regions, sub-systems or substructures as, for example, a buried nanoscale layered system containing silicon metamaterial.

The specific field or domain of the invention is the light-to-electricity conversion photovoltaic cells.

2. DEFINITIONS

LEEG—Low-Energy Electron Generation is a process whereby multiple electrons are produced upon absorption of a single photon in semiconductor nanoobjects. The effect represents a promising route to increase efficiencies of solar light conversion in single-junction devices.

Segton—is a unit of the Secondary Electron Generation Tuned on Nanoscale, i.e., conditioned elemental unit cell of matter characterized by its specific and highly useful set of electron energy levels that is adapted for an efficient multistage light-to-electricity conversion; the system allows a low-energy electron photogeneration of additional free-carriers and a carrier multiplication cycle. More generally it is also a method of, how to produce the highly useful set of electron energy levels that can be optimized for the solar spectrum conversion to electricity. And further, segton is the semiconductor nano object having a specific set of electron energy levels that is able to complete the electron energy levels of natural semiconductor materials, preferentially silicon, useful for ultra-high efficiency light-to-electricity converters.

Seg-matter—is a segton based metamaterial, i.e., the specific material for an efficient light-to-electricity conversion that is constituted of homogeneously distributed segtons that form an ordered superlattice and are plunged in a specific physical environment bordered by nanomembranes as protected by means of parallel patent applications. More generally, this expression means also the method of how to produce the matter being able to exploit the set of segton energy levels. The seg-matter metamaterial in formed in one layer or more. And further seg-matter is the semiconductor artificial matter forming a metamaterial, which allows segton conditioning and assumes multifaceted functionality, which is principally available at the nanoscale.

Divacancy: structural point defect that forms a specific structural unit in a semiconductor, where different atom bonds, like molecular bonds, appear in a covalent material MTM: silicon based metamaterial a-Si: amorphized silicon phase <a-Si>: amorphized silicon phase under strain c-Si: crystalline silicon phase <c-Si>: crystalline silicon phase under strain BSF: back surface field BSF interface: LH type semiconductor junction resulting from the abrupt or gradual change of the doping impurity density

3. BACKGROUND OF THE INVENTION

Today's the photovoltaic effect is obtained and based on single junction and multi junction planar semiconductor devices. This simple architecture exploits natural materials which may be optionally slightly modified. The photon interaction with the matter relies on two principles: all or nothing and one photon one electron-hole pair.

An effective improvement has to pass through new, preferentially artificial materials, new mechanisms or new light-to-electricity conversion processing.

4. NANOSCALE UNITS FORMED INSIDE A SILICON MONOCRYSTAL

An artificial material component is a nano object representing a building block of the buried nanoscale substructure. This unit is called hereby segton. Each segton represents an elementary silicon crystal unit minus two silicon atoms, displaced outside, that is in strictly determined, doubly-negative electric-charge state and is advantageously and necessarily coupled to their strictly conditioned physical surrounding.

Segtons provide the converter in a new set of electron energy levels allowing new generation mechanism, e.g. the secondary electron generation that is characterized by a particularly low specific energy. Segtons contain weakly bonded electrons that can be easily released during collisions with hot electrons leading to an electron multiplication cycle when a suitable electron dynamics, electron extraction and segton recharging, becomes possible. In this way, the additional kinetic energy of hot electrons resulting from the primary generation coming from absorption, is itransformed into an additional near-equilibrium electron population. In general, hot or warm electrons can result from light irradiation, electric field acceleration or other effect as carrier injection.

Such a structural nano object is built on the base of a divacancy that is intensely conditioned by its physical environment. The transformation of the useless, normally harmful, divacancies into useful segtons becomes possible by the fulfillment of a number of requirements regarding their electrical state and their distribution within the host converter material. By a specific physical and technical conditioning, the purely physical nano object is turned into a nano object highly useful in technical applications.

Segtons behave like molecular matter functioning as ideal building blocks and contain ordering on two different length scales: atomic interaction level and nanoscale organization level.

The segtons remain the analogy with silicon nanocrystals. In both cases a set of electron energy levels is artificially tuned to efficient interaction with, for example, the solar spectrum. In this way, the single primary electron-hole generation due to absorption of energetic photon is transformed into multiexciton generation; the effect that can lead further to a free carrier multiplication.

Two types of silicon modifications then appear when shaping in silicon. nanocrystals:
i) quantum mechanical related to the size of nanocrystals and
ii) specific energy states located at the nanocrystal interface.

The segton alone, being necessary, is insufficient to increase the conversion performance. It has to be built-in in a metamaterial called seg-matter.

Contrary to nanocrystals, where the critical problem concerns the free carrier extraction and collection, segtons are plunged in a perfectly conducting environment allowing an excellent extraction and collection.

The specific combined set of electron energy levels of the c-Si crystalline silicon phase, i.e., energy band system and of the silicon segton, i.e. extrinsic energy levels within the band gap, is well adjusted energetically for the solar spectrum and allows an optimized light-to-electricity conversion. The secondary electron population results from a collisional liberalization of weakly bonded electrons by hot or warm primary electrons.

This invention is of particular importance because as silicon largely dominates the photovoltaic industry, it presents no problems regarding abundance and accessibility within the Earth's crust, and poses no significant environmental problems regarding toxicity and recycling. The last development of crystalline silicon devices, representing in a someway a return to the first photovoltaic generation, is an excellent base for such improvements being covered by the invention.

4. SHORT DESCRIPTION

This invention bears on elementary nanoscale units nanostructured-formed-embedded inside a host semiconductor material or matrix and the manufacturing process to implement them. Due to strictly imposed structural and optoelectronic conditions a localized nanoscale transformation of the crystalline matter get an unusual functionality by focusing in it a specific physical effect as is a highly useful additional set of electron energy levels that is optimized for the solar spectrum conversion to electricity. An adjusted energetically system allows a low-energy secondary electron generation in a semiconductor, preferentially silicon material.

The creation or manufacturing process to produce such transformations in a semiconductor material is based on a local energy deposition by an irradiation that can be no focalized as by cosmic rays, or more or less focalized as by γ rays, X rays, electron beam or ion implantation, as well as, following suitable thermal treatment and is industrially easily available.

The elementary nanoscale units according to the invention and called segtons are advantageously coupled to their physical surrounding that is strictly physically and technically conditioned and are usefully placed within the converter from the viewpoint of the incident light radiation and absorption. Segton allows the analogy with a nanocrystal that is able to tune energy levels being available for electrons. The ultra-fast segton dynamics allows continuous and sufficiently rapid conversion cycle in semiconductor silicon based converters. Contrary to nanocrystals that are usually embedded in a dielectric, the heavily doped semiconductor environment, in which the segton is totally plunged, assumes an excellent conductivity.

Indeed, the specific set of electron energy levels with an excellent electron conduction and transport distinguishes segton from other nanoscale transformations known up to nowadays. The ability of extraction and collection of electrons from segtons predestinates their technical applications, especially in very-high efficiency all-silicon light-to-electricity converters.

5. CONDITIONED DIVACANCIES AND REQUIREMENTS AND FULFILLMENTS

An artificial nanoscale component should be able to complement the conventional conversion process by several new additional mechanisms allowing an optimized adaptation of the silicon semiconductor converter to the solar spectrum The person skilled in the art will understand that the invention disclosed and claimed herein after in the present application has to be considered at three different levels, in particular when contemplating the claimed segton and its production method.

Segton is constituted of an elementary unit based on divacancy. As such, divacancy is known as a physical object, but has generally been looked at, up to the present invention, as being totally useless in electronic and optoelectronic applications. Such a divacancy was even usually described, up to the filing date, as harmful structural defect that is to be repaired or cured or gettered. As a physical object the point defects or divacancies are distributed randomly and sparsely after an irradiation such as simply irradiation of electron or ion beam, or γ and X ray beams. On the contrary, according to the invention, to become a useful technical object, this elementary unit has to be conditioned during a suitable specific technological processing assuming, by the way, an optimized nanoobject distribution and density. It means that it has to be preserved in all encountered thermal conditions i.e., processing temperatures reaching 550° C., whereas normally divacancies recombine at temperatures lower than 250° C. The new material can be then organized from building blocks ordered in a superlattice. In this way, the density, distribution, position and behavior of nanoobjects based on divacancies can lead to technically useful applications.

An artificial component of new material combines advantageously useful effects and processing to fulfill the desired functionality, which was normally unachievable. Two of the most specific features of said segton concern its near permanent electric charge-state, i.e., the ultra-fast regeneration of the charge-state. The double charge-state must allow a new and unique conversion mechanism, i.e. the neverending low-energy generation, to fully function. In general, the dynamics of the secondary generation based on segtons concerns:

- segton useful electric state and exposure to collisions with hot or warm electrons to optimize the conversion of the kinetic energy into an additional electron population as a membrane-like substructure,
- competition in the time scale between the hot or warm electron generating collisions and their harmful thermalization, i.e. the heating of the silicon lattice; the hot electron-lattice interactions have to be controlled in the temporal and geometrical scales,
- extraction of the secondary electron outside the seg-matter nanolayer after its collisional generation and, by the consequence, its injection into the surrounding emitter space and maintaining its inability to return to the starting point by an electric screening,
- excellent conduction of secondary electrons at the near equilibrium energy across the emitter between the seg-matter and the front face electrode,
- collection of secondary electrons by the front face electrode as a recombination-like effect,
- local conduction of replacement electrons across the seg-matter allowing the suitable, extremely fast regeneration of the segton charge state due to "other" electrons arriving from deeper strata of the converter injected by the rear electrode due to the circulation through the external circuit,
- specific unipolar conduction in the seg-matter allowing the segton regeneration by means of specific fast conduction across impurity band.

It is presumed that the way how to transform and use the well-known and harmful nanodefect into a useful elementary material unit has never been disclosed before in the state of the art.

Manufacture

The method to create and manufacture the nanoscale unit according to this invention will now be shortly described with general terms and expressions in the following section.

The fabrication or manufacture and conditioning of segtons has to allow simultaneously the required functionalities:

i) the creation of specific nano objects with type, electric charge-state, density, location or position in geometrical space that result from a re-organization of atoms in the crystalline lattice; such a reorganization can also appear in amorphous or amorphized phase,
ii) the useful insertion of a suitable set of electron energy levels that enables the low-energy generation of secondary electrons,
iii) to assume the specific functionality resulting from the synergy of several physical interactions that can be activated and sometimes exclusively reached on the nanoscale,
iv) to assume an electron circulation when the generation and recombination places of secondary electrons are suitable separated or screened; this concerns, for example, a harmful recombination taking mainly place at the converter front face.

In general, the required functionality results from two types of combined effects: those that are intimately related to the nano objects as matter structures, i.e., segtons themselves, and those that are related to physical fields triggered at the nanoscale by the neighborhood as, for example, semiconductor interfaces with their transition zones.

6. GOAL AND BENEFICES OF THE INVENTION

The invention is dedicated to an enhancement of the light-to-electricity conversion. This is realizable due to a useful transformation of the additional electron kinetic energy resulting from absorption of energetic photons, today totally lost due to the thermalization, into an additional electron population that is collectable in the external circuit. Such a conversion becomes possible due to nanoscale units for secondary electron generation tuned on nanoscale called segtons. Technically useful segtons fulfill several conditions such as to be sufficiently numerous and well distributed, placed in a well-defined nanospace, and have to permanently conserve their useful electric-charge state. All this leads to the following improvements and benefices:

- New high efficient light-to-electricity converters with the thermodynamic limit of about 63%.
- New devices manufactured from an abundant, ecologically friendly material processed with a mature technology as is silicon.
- New conversion mechanisms complementing conventional operation mode due to their low-energy behavior.
- New electron energy set allowing the photoconverter adjustment to the solar spectrum.
- New manufacture processing leading to a new conversion materials and structures complementing the basic material and device architecture
- All-silicon light-to-electricity converters with ultra-high efficiency are then possible because of the superposition of adjusted silicon derived materials. This possibility reminds specificity of the tandem cells.
- The invented processing bases on the best matured silicon technology, and requires limited modifications or complements of existing production facilities.
- The energy needed for transformation of the elementary unit cell of crystalline silicon into divacancy or segton can be provided, for example, by the ion implantation e.g., Si, P species.
- The original energy bands of the silicon that are less adapted to the conversion of solar spectrum can be adjusted advantageously by a complementary set of energy levels from segtons that is especially optimized for the conversion of visible and UV photons. In this way, the silicon converter contains energy levels and bands arranged for optimal conversion processing of the solar spectrum.
- Segton, as a building block, which can be shaped in an abundant and environmentally friendly material as is the silicon.
- New mechanism possible due to segtons concerns a low-energy electron generation and corresponding electron multiplication cycle. Additional electron energy is then transformed into an additional electron population.
- The converter with segtons operates due to two types of carrier generation: the primary single electron-hole conventional generation and the new secondary electron generation. In other words, the simple primary generation of the electron-hole pair resulting from photon absorption is transformed into a multistage conversion cycle.

The secondary generation allows avoiding of the harmful thermalization of hot electrons i.e., the heating of the silicon lattice. Due to adjusted converter architecture the hot electron interaction can be controlled in the temporal and geometrical scales.

In the field of all-silicon converters it is relatively easy to keep the segton in a permanent charge state that is required by optimal device functioning.

The device manufacture which includes all nano transformations, the converter functioning and its final destruction are totally devoid of processing steps with free nano particles that can be dangerous for environment and human being.

The manufacture can be assumed by well experienced industry operators such as engineers and technicians.

One of the most important new fabrication processing is well compatible with known technology of silicon converters and concerns the well-known ion implantation and subsequent thermal treatment.

8. DESCRIPTION OF THE PREFERRED EMBODIMENT

The nanoscale unit according to the present invention is an elemental unity that is constituted and conditioned around the elemental unity of crystalline silicon lattice containing a structural point defect called divacancy. These nanoscale units called segtons are advantageously and necessarily coupled to their physical surrounding that is strictly physically conditioned and are usefully placed within the converter from the viewpoint of the incident light radiation and absorption.

Segton is constituted on the basis of the divacancy being quasi-permanently in a doubly negative charge state and is conditioned by its physical neighborhood.

Due to strictly imposed structural and optoelectronic conditions, the usually harmful defect can be advantageously transformed into a useful nanoobject that has an electron energy-level set adjusted to the low-energy secondary generation and multiplication in silicon converters. Thus the segton is able to provide its host material or matrix into a set of specific electron energy levels that distribution and dynamics allow continuous and sufficiently ultra-rapid conversion cycle.

Segton results from a displacement of two atoms outside the crystalline, preferentially, silicon elementary unit that introduces prolonged electron bonds going through vacancy sites that are able to capture and localize free electrons occupying extrinsic energy levels, especially weakly bonded electrons.

This displacement may be realized by an energy beam focused and deposited inside the semiconductor matter or lattice or matrix such as electron beam, ion beam, and other suitable irradiations.

Segton contains short and long electron bonds such as dangling bonds of the molecular-like type that have to be permanently occupied by captured electrons in working converter. This corresponds to a specific permanent doubly negative electric-charge state that has to be assumed by segton immediate environment tailored to the nanoscale.

To be useful in the efficient light-to-electricity conversion the segton dynamics is extremely fast that is characterized by extremely short time constants. That signifies first of all an extremely fast dynamics of segton charging and discharging.

Being embedded in a given host material such as a semiconductor and preferentially the silicon, the segton allows the analogy with a nanocrystal that is able to tune energy levels being available for electrons. The n-type heavily doped semiconductor around segton in which the segton is totally plunged, assumes an excellent conductivity. The ability of extraction and collection of electrons from segtons predestinates their technical applications. In general, the unique segton feature, i.e., combining the specific set of electron energy levels with an excellent electron conduction or transport distinguishes segton from other nanoscale transformations known up to nowadays.

The preferred method of segton manufacture is based on buried amorphizatons nanovolumes that are wrapped around by a nanolayer grafted with divacancies during the process.

The electric charge-state with its ultra-fast regeneration behavior must allow a new and unique conversion mechanism, i.e. the neverending low-energy generation. In general, the dynamics of the secondary generation based on segtons concerns:
- useful segton exposure to collisions with hot electrons to optimize the conversion of the kinetic energy into an additional electron population such as a membrane-like substructure,
- competition in the time scale between the hot electron generating collisions and the hot electron thermalization,
- extraction of the secondary electron outside the segton neighborhood after its collisional generation and, by the consequence, its injection into the surrounding emitter and maintaining its inability to return to the starting point,
- local conduction of replacement electrons across due to a specific conduction mechanism allowing the suitable ultra-fast regeneration of the electric charge-state of segtons due to other electrons arriving from deeper strata of the converter; injected by the rear electrode due to the circulation through the external circuit,
- specific unipolar conduction in the segton environment allowed by the specific fast conduction across impurity band.

A method of nanoscale transformation being able to fulfill several required conditions is based on a local amorphization of a previously crystalline semiconductor, preferentially silicon, using, for example, an ion beam. This processing allow a good localization of the point defects in the device space and can lead to a self-organization in an ordered superlattice due to the built-in strain field that is induced by dilatation forces at the c-Si/a-Si interface. The strain field governs the segton distribution during the thermal treatment.

There are, at least, two possible methods of implementation:
i) two step processing that consists of a previous n-type doping (preferentially P) profile by a diffusion or implantation that is next followed by an ion implantation up to a local or buried amorphization (P, Si),
ii) single ion implantation up to local/buried amorphization using exclusively doping ions (preferentially P).

Both mentioned methods lead to locally heavily doped material (preferentially Si:P) and allow, by the consequence, a unipolar conduction involving simultaneously the impurity and the conduction bands. The choice depends on the fine adjustment to the converted spectrum.

In the first step, the amorphization produces rough or rugged a-Si/c-Si heterointerfaces and small a-Si inclusions in c-Si and c-Si inlusions in a-Si. The subsequent annealing cycle, preferentially at about 500-550° C. takes the form of a solid state epitaxy and leads to clear, atom scale separation of both silicon phases (crystalline and amorphized) as well as to sharp planar a-Si/c-Si heterointerfaces. The same annealing cycle leads to the creation of more or less planar nanolayers that are smoothly wrapping the each amorphized grain. The said nanolayers of 3-5-10 nm thick are uniform, without any faults and inequalities and contains numerous and ordered segtons forming together a seg-matter which is silicon based metamaterial MTM.

The limited displacement of Si atoms inside the elementary unit requires relatively very low energies per displaced atom (about 2.5 eV/atom). Such displacement of two atoms leads introduces prolonged electron bonds that can capture and localize electrons. To become technically useful the divacancy has to contain permanently 4 captured electrons where one of them is weakly bonded. This is possible, for example, in a heavily n-type doped material, e.g., provided with the high phosphorous doping (Si:P).

Structural Transformations and Segton Conditioning:
- phase transformation by an ion implantation: crystalline→amorphized→crystalline with locally highly concentrated point defects that are processed further into segtons during a cycle of the thermal treatment
- c-Si/a-Si interface resulting from the ion implantation: creation→smoothing→conditioning to the seg-matter
- local homogenization of amorphized and crystalline phases due to an annealing cycle: dissolution of inclusions of one material phase within another phase
- nanomembranes delimiting seg-matter: a-Si/c-Si→<a-Si>/<c-Si>—energy barrier (a high offset in the valence band) and <c-Si>/<a-Si>—change of the electron transport mode
- conditioning processing of segtons through an annealing cycle: activation of heavy doping.

Further Explanations
i) the practically doubly permanent electric charge-state, i.e., the permanent availability of a weakly bonded electron—to answer this requirement Segtons have to be plunged in a heavily doped n-type semiconductor environment, e.g., P-doped Si, with the doping density varying between $10^{18}$ to $10^{21}$ atoms $cm^{-3}$. Such a doping can be realized in several well-known ways; the choice of the way depending on the converter design and the just the best technological processing. For example, 1) by a diffusion from a $P_2O_5$ surface source at the temperature of 850-1000° C. during about 20-40 min.; 2) by a P-ion doping implantation leading to a local impurity maximum near the implantation range—the implantation energy lies between 10 and 200 keV, 3) by a rapid thermal treatment (RTT) from a $P_2O_5$ surface source at the temperature of 1000-1250° C. during tens of seconds, 4) by a local laser surface recrystallization of a previously low-energy implanted semiconductor—implantation energies lie in the range of 10-50 keV.
ii) two different and complementary sets of electron energy levels occupying interpenetrating geometrical spaces due to nanoscale insertions of the chemically same materials
iii) two different electron transport mechanisms in and out of Segton; out by the conduction band and in by the impurity band; this effect is easily controlled by the n-type doping and by a built-in electric field of the LH-like heterointerface of the a-Si/c-Si transition
iv) segton allows valve-like action due to its energy level set and due to its local geometrical position; one allows a unidirectional movement of electrons in energy space and the second in the geometrical space by distancing from one another outgoing and ingoing electrons

TABLE

Basis of improved photoconversion.

| Object | Operation |
|---|---|
| converter | main goal of the nanostructuration: incorporation of new efficient conversion mechanisms into conventional rather Si converters—an efficient low-energy secondary generation introduction of appropriate facilities into the device emitter by appropriate depth and fine structure design of substructure(s) design of substructure(s) for a low-energy secondary generation—mapping, architecture, superposition, . . . |
| amorphizing ion implantation | appropriate distribution of amorphized nanoobjects with suitable initial sizes: insertions/substructures substructures providing the converter in fine in reservoirs of segtons and seg-matter appropriate processing—one beam or more beams, energies, doses, angle(s) of the incidence, species, the order, looking for interactions, conditions, for example, target temperature, shaping with respect of further processing by eventual superposition of successive treatments, balance of overall processing, previous and further processing steps, specific conditions |
| structure | the cycle(s) of thermal treatment has(ve): at first place, to figure the two neighboring areas on both sides of the c-Si/a-Si heterointerface to order their extreme mismatch just after the amorphization to dissolve or restructure inclusions of opposite phases that is a-Si in c-Si and c-Si in a-Si to release the crystalline <c-Si> phase stuffed with numerous point defects and to uniform the distribution of the crystalline <c-Si> phase that has surround homogeneously the amorphized objects to homogenize the distribution of segtons inside the crystalline <c-Si> phase that can be denser close to the <a-Si>/<c-Si> interface and rarer close to the <c-Si>/c-Si interface to well-form, smooth and stabilize c-Si/a-Si interfaces to become uniform, aligned and stabilized due to the dilatation strain, especially on the c-Si side |
| n-type doping | previously on or simultaneously with amorphization activation of the heavy n-type doping by a better ionization rate due to ion implantation |
| electric charge state | permanent doubly negative charge state under light illumination extremely fast dynamics of segton recharging after a secondary generation |
| electron transport | free vertical transport through the emitter allowing an optimal carrier collection advantageous weighting between the transport mechanisms of conduction and impurity bands |
| characterization | optical: intermediate characterization, for example reflectivity, using testifying reference samples or dedicated wafer areas by proceeding without implantation masks or with dedicated scanned paths electronic: I(V) curves |

9. THE INVENTION AND ITS MANUFACTURING PROCESS

To be technically useful, segtons have to be sufficiently numerous and well distributed, placed in a well-defined nanospace, permanently conserve their useful charge state, allow temperature processing during device manufacturing without threat of their erasing or transformation. Contrary to divacances that are normally spread sparsely and randomly in the semiconductor, preferentially silicon, material, segtons representing technical objects, are concentrated in a well delimited nanolayer nanospace.

One of the best techniques being able to assume numerous requirements concerning segton shaping is the transition of silicon phase around an amorphized-crystalline heterointerface i.e., a controlled recrystallization of the previously amorphized crystalline material. An order-disorder atomic scale transition leads to dilatation strain that allow the conditioning of a planar-like heterointerface due to a suitable solid-state epitaxy.

The recrystallized material has a dominant crystalline behavior but contains numerous displaced atoms that are distributed rather uniformly. The controlled recrystallization has to respect several conditions concerning the recrystallization or the solid state epitaxy rate, temperature, delay to conserve numerous displaced atoms in their new positions and to avoid additional harmful structural damages resulting, for example, from too violent atom movements.

This is the only one processing that is able to satisfy all the mentioned above requirements simultaneously, namely the ion implantation and a well-controlled, subsequent or real-time, thermal treatment. This processing allows a good localization of the transformed material from the absorption viewpoint.

The a-Si/c-Si heterointerface transition zone gathers numerous segtons, up to the density of about $10^{20}$ cm$^{-3}$, which are trapped within the dilatation or tensile strain field. This tensile field plays, at least, four roles:
 i) reduces divacancy recombination during thermal treatment,
 ii) reduces divacancy mobility allowing their trapping in a well-defined and limited volume space,
 iii) allows the conservation of divacancies at unusually high temperatures of 500-550° C. during the device manufacture and
 iv) orders segton distribution into a self-ordered superlattice network.

The ion implantation and subsequent processing allows fulfillment of other requirements as the permanent double negative charge state, the spatial disposition, the electron transport etc . . . . All these transformations lead to metamaterial build from segtons. The segton double negative charge state allows a low-energy electron transition/release between the divacancy/segton energy level in the upper half of the indirect Si band gap and the conduction band. The concentration of doping impurity for n-type semiconductor has to be large enough such as $10^{18}$ to $10^{21}$ atoms cm$^{-3}$, to charge and recharge all numerous divacances. The technically useful double negative charge state has to be instantaneously renewable just after an electron emission and extraction.

In general, the fabrication or manufacture and conditioning of segtons has to allow simultaneously:
Ion implantation with the implantation energy of 10 to 200 keV and ion doses of $10^{14}$ to $10^{16}$ ions cm$^{-2}$ leads to the creation of specific nanoobjects type, electric charge-state, density, location or position in geometrical space, resulting from a reorganization of atoms in the crystalline lattice and/or in the amorphous/amorphized phase; the structural transformation leading to a new material phase results from an accumulation of point defects concentrated or contained in a specific space under the form of a nanolayer; for example, the density and the internal energy of the new phase is lower than of its crystalline counterpart being placed in the transition zone between crystalline and amorphized phases.
Doping profile of the n-type and dense enough about $10^{18}$ to $10^{20}$ atoms cm$^{-3}$ may be obtained, for example, in two ways, by the diffusion of doping ions or by the suitable doping ion implantation. The specific high density of the doping profile concerns mainly the buried substructure and its near neighborhood.

Material modulation and structural transformations: to obtain a new phase of well-known "old" material, being useful in soft light-matter interactions, one can start, for example, from its crystalline phase by its local deep transformation leading to a specific modulation of atom positions in crystalline lattice. Such an atom scale processing, results, for example, in shifting some atom population from their equilibrium sites in the crystal unit cell into metastable sites that are usually unoccupied. The new metastable atom distribution has to concern a large enough atom number. The required processing has to allow a local energy deposition as, for example, the irradiation by a more or less focalized energy beam. The operation is able to shift a numerous atom population occupying a specific volume and assumes in this way a necessarily profound material modulation.

Example of material modulation leading to the creation of segtons: an ion irradiation allowing the required material modulation is realized in several stages:

the initial n-type doping profile, e.g., phosphorous, by the so-called low-temperature thermal diffusion at T<1000° C. or another method such as doping implantation in the homogeneously, lightly or moderately p-doped wafer, e.g., pre-doped by boron, pre conditioning of the wafer surface after the diffusion process to allow a good control of the implanted volume, 50-200 keV ion beam irradiation leading to a buried amorphization, possible, for example, by two ways, by a self Si implantation or by P implantation, constitution of excellent c-Si/a-Si heterointerfaces by the thermal annealing cycle, for example at 500° C., constitution of MTM nanolayers by the thermal annealing cycle, for example at 350-450° C., activation of segtons device final processing steps, i.e., AR coating, electronic passivation, metallizations.

10. EXPLANATION BY MEANS OF THE FIGURES

You will find hereunder a brief description of the invention with the help of the appended figures.

Figure 1:
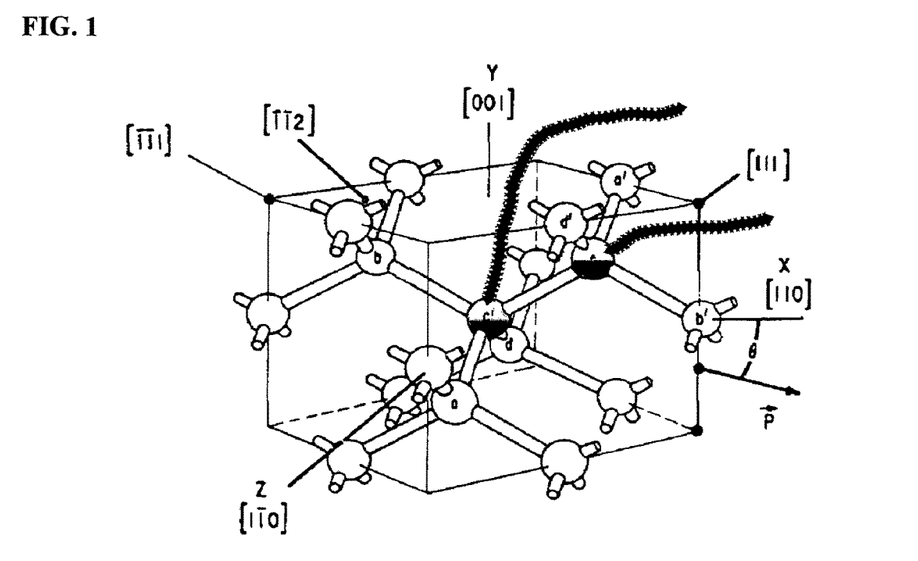
FIG. 1 is one of the known representations of the elemental silicon cell with arrows indicating atoms shifted out to form a segton.
Figure 2:
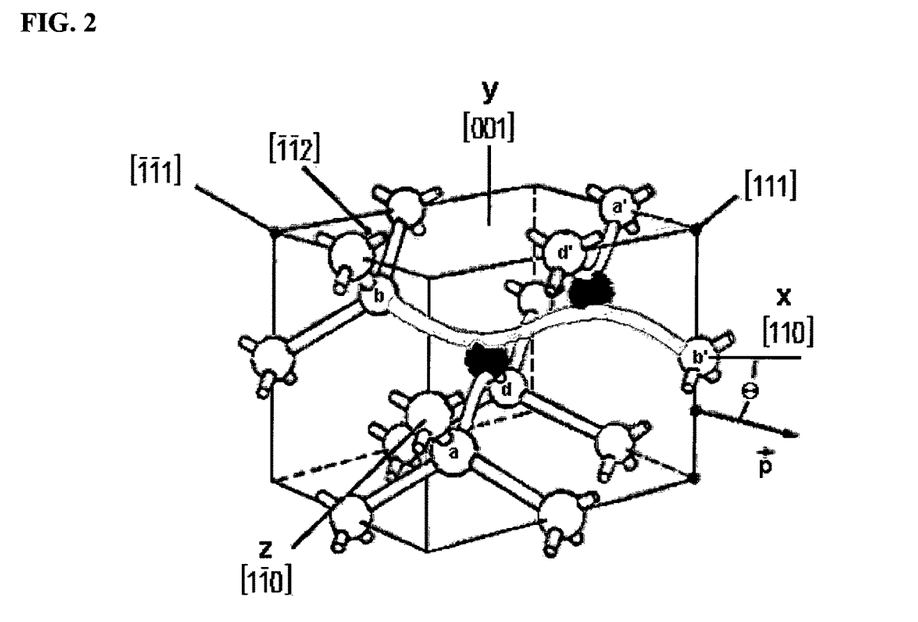
FIG. 2 is a model of the divacancy deduced from EPR (Electron Paramagnetic Resonance) studies.
Figure 3:
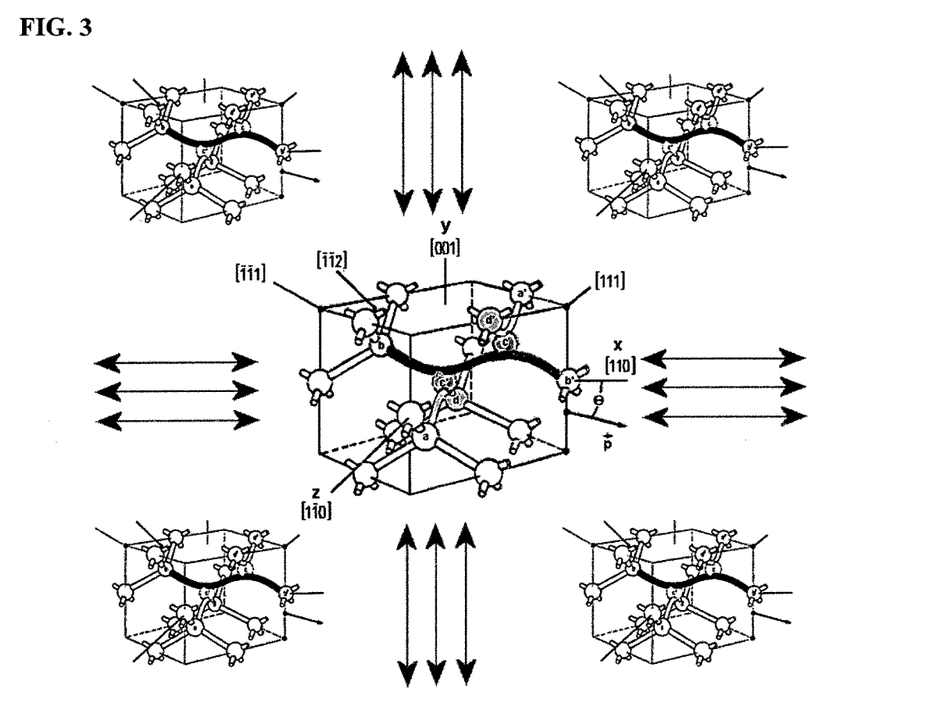
FIG. 3 is a free schematic representation of a segton on the background of the ordered superlattice, i.e., their segton distribution inside the metamaterial nanolayer.

The FIGS. 1 and 2 bear on the specific model of the segton based on a divacancy conditioned by physical fields symbolized by triple arrows (FIG. 3), which are at least: doping impurities, a built-in electric field and a built-in stress field. Segtons result from suitable and complex defects conditioning. In the FIGS. 1 and 2, atom engineering: elemental crystalline unit of silicon a) with all "equilibrium" atoms two of them will be removed out which is symbolized by two solid black curved serrated lines (FIG. 1), b) without two atoms i.e. divacancy leading to prolonged atom bonds going through vacancy sites (c, c') that replaces usual covalent bonds: a-d, a'-d' and b-b'.

This is a metastable state well-conserved at:
i) T<250° C. when the matter is relaxed and
ii) T<550-600° C. when the matter is under local tensile strain.

A weak bond is indicated by a solid black line appearing between b-b' atoms (FIG. 2). This line goes through c-c' vacancies. There are three equivalent weak bonds through c-c' vacancies: a-a', b-b' and d-d'. In the metamaterial a Jahn-Teller distortion appears. Symbols in figures: Cartesian coordinates (x, y, z), [1,0,0] crystalline axis orientations, and vector P, angle $\Theta$.

Four other segtons (FIG. 3) symbolize the background of the ordered segton superlattice, i.e., their distribution inside the metamaterial MTM nanolayer. The segtons result from suitable and complex defects conditioning. The scheme of a divacancy conditioned by physical fields is symbolized by the triple arrows:
i) a built-in electric field,
ii) a built-in stress field and
iii) a defect field from neighbor divacances; four other segtons symbolize the ordered segton superlattice, i.e., their distribution inside the MTM nanolayer.

Figure 4:
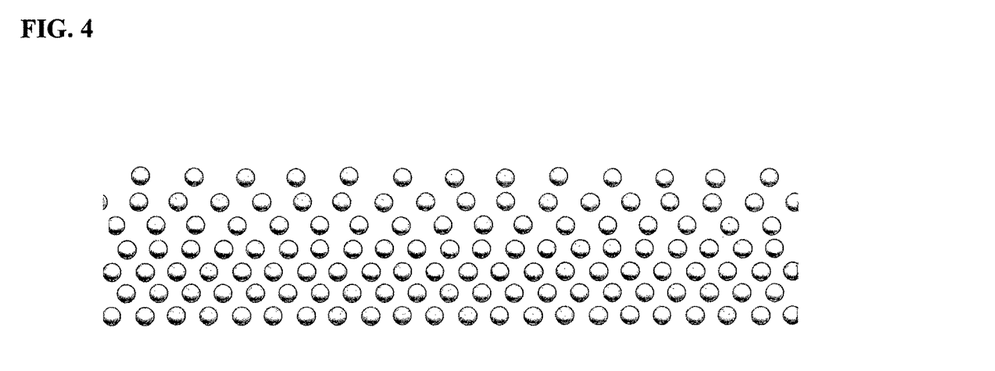
FIG. 4 is an example of scheme of the ordered superlattice of segtons with their closest environment i.e. numerous segtons as the result of suitable and complex defects conditioning.
Figure 5:
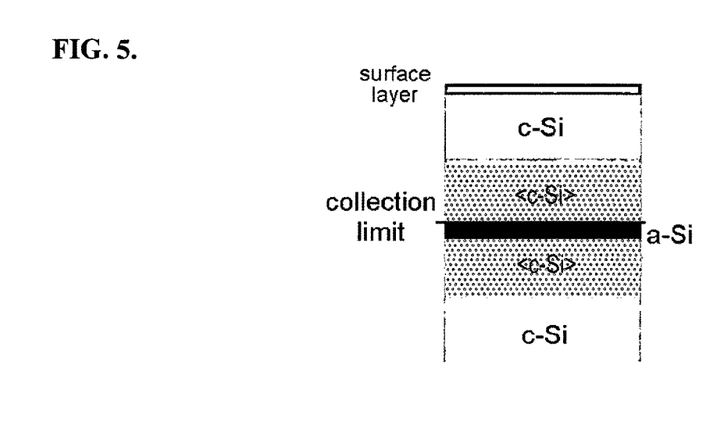
FIG. 5 is a schematic sectional view representation of the upper part of the emitter where the metamaterial is inserted.

FIG. 4 is a mere general and schematic view of a model of an example of a metamaterial MTM nanolayer with smoothly varying density of segtons; the higher density is closer to the realizing amorphous phase decreasing in the crystalline phase.

FIGS. 5 to 8 show scheme of a nanoscale Si-layered system containing a metamaterial (<c-Si> nanolayers) of nanostructured silicon which has been obtained by doping, ion implantation and adequate thermal treatment (drawing not to scale). Two upper layers (c-Si and <c-Si>), above the collection limit, represent a surface reservoir filed with free-carriers resulting from doping and light primary and secondary generations.

Figure 6:
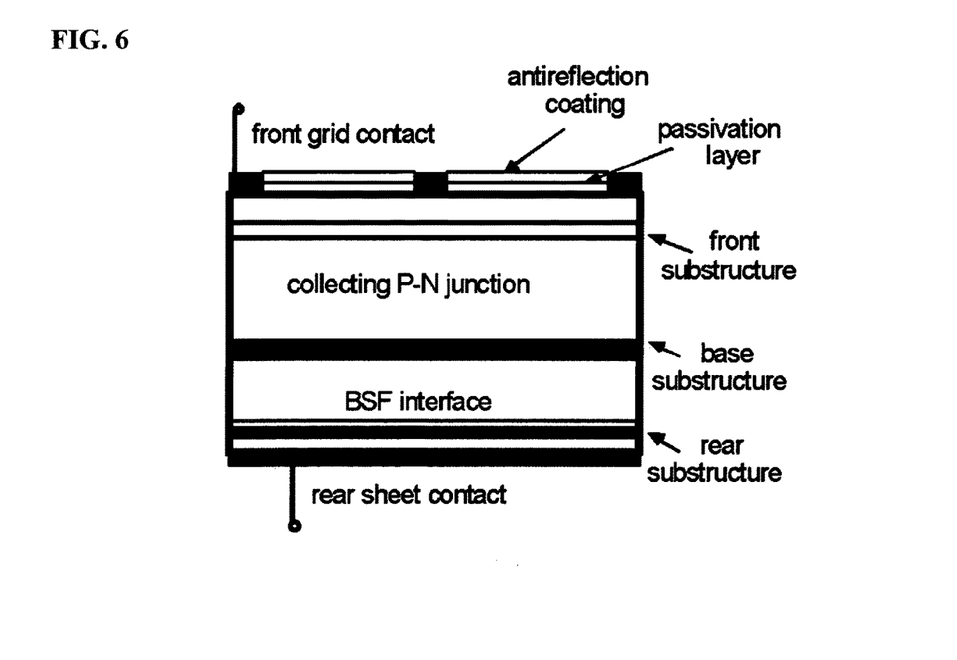
FIG. 6 is a general sectional view of a converter in which all different component parts, more or less complicated architecture, are present.

FIG. 6 shows an example of a device with a planar architecture containing one of the possible combinations exploiting the nanoscale Si-layered systems with a Si metamaterial. The arrangement of three specific substructures within: the emitter, base and rear face zone that allow better conversion of specific solar spectrum components taking into account the average penetration depth of photons. The presented device is provided in a back surface field (BSF).

Figure 7:
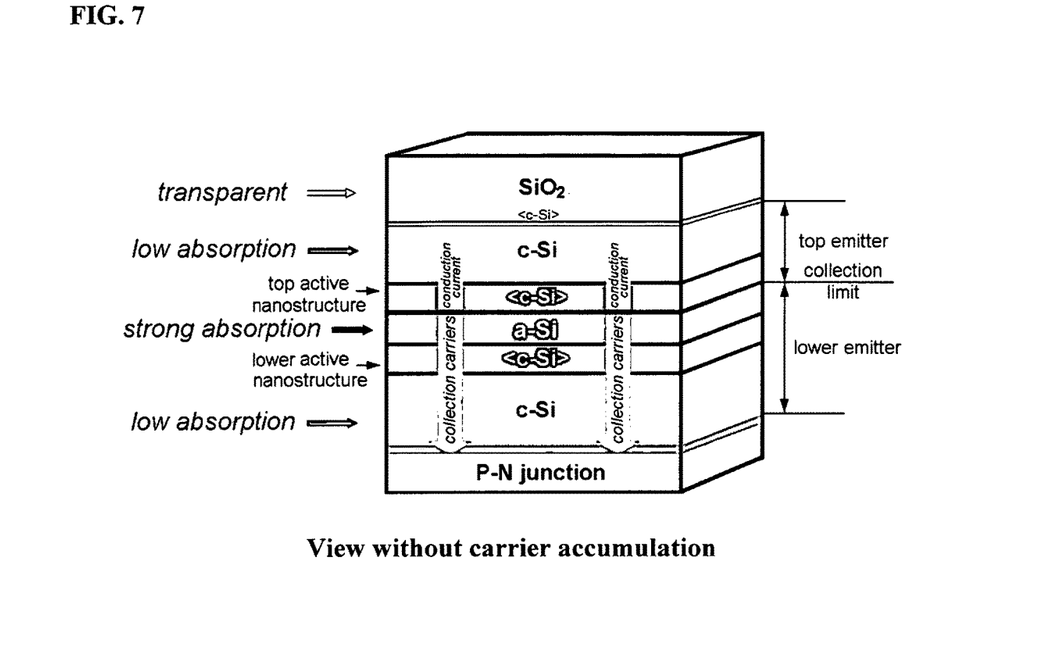
FIGS. 7 and 8 are schematic representations in bloc type's style of a multilayer structure of a device respectively without and with free-carrier accumulation.
Figure 8:
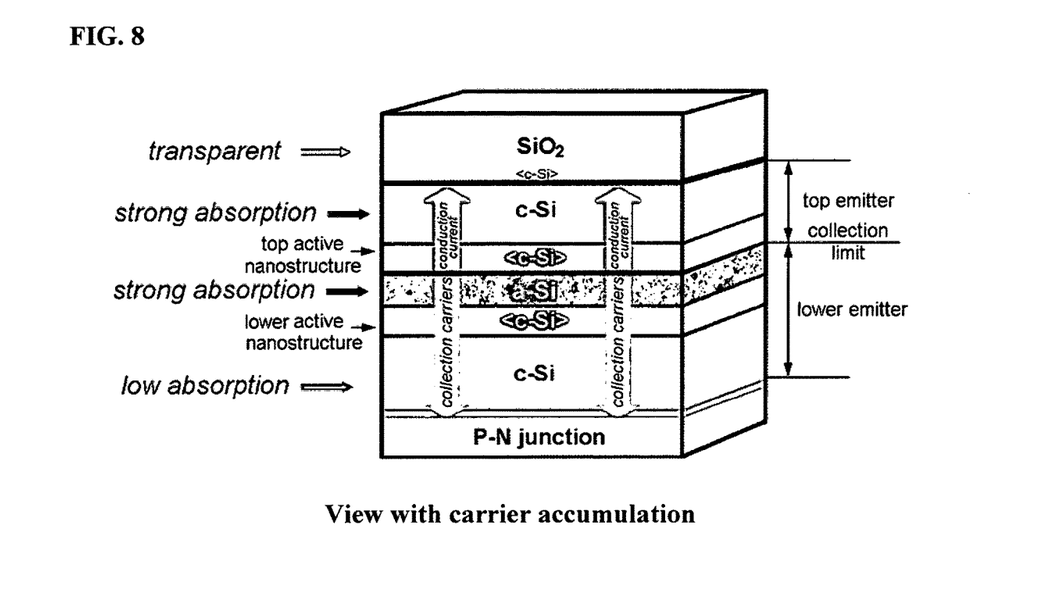

FIGS. 7 and 8 schematize a top of a crystalline Si wafer containing a buried substructure being able to combine optoelectronic features (not to scale). Simplest nanoscale transformations lead to the superposition of several specific layers and especially a silicon metamaterial; three nanolayers denoted <c-Si>; one at the $SiO_2$/Si interface and two at a-Si/c-Si interfaces that are labeled in the figure as top/and lower active nanostructures. One of the specific effects, i.e. the surface free-carrier reservoir, results from the carrier collection limit (CCL) which appears at the upper a-Si/c-Si interface. Upper graph ignores the free-carrier accumulation due to a confinement, while the lower graph takes this into account indicating more realistically regions of the strong light absorption. Another specific effect concerns collection properties of photogenerated free-carriers; signaled by collection-carriers and conduction-current arrows.

Figure 9:
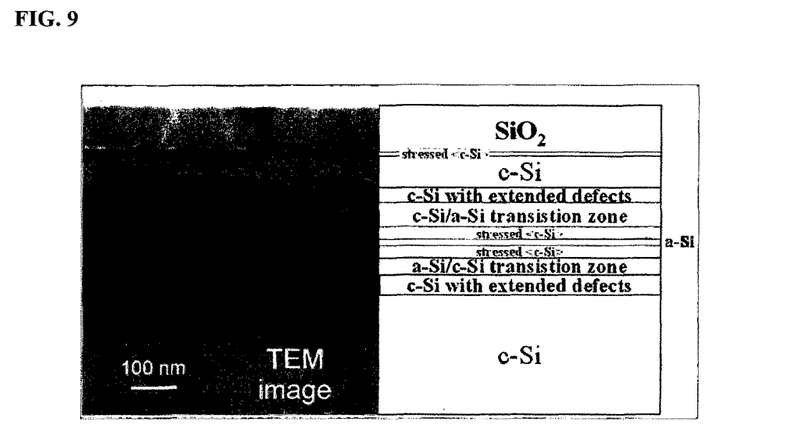
FIG. 9 is a cross section TEM image of the planar multi-interface substructure realized by a controlled recrystallization of the amorphized phase buried by ion-implantation and post-implantation processing within a crystalline silicon; details are explained in the right graph illustrating 2D nanoscale sub-structure.

FIG. 9 is a cross section TEM image presenting an example of the planar multi-interface substructure realized by controlled recrystallization of the amorphized phase that is buried by ion-implantation and post-implantation processing within a crystalline Si. Details are explained on the right graph illustrating 2D nanoscale Si-layered system.

Figure 10:
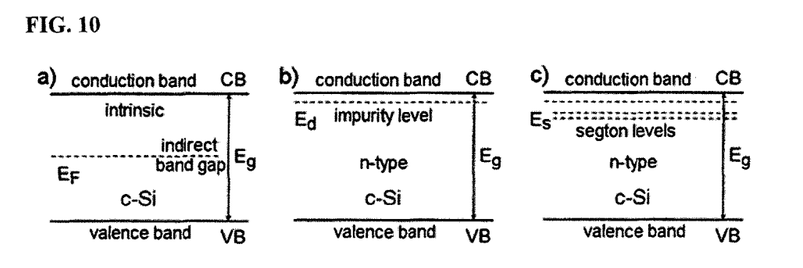
FIG. 10 is a schematic illustration of transformations of the electron energy band and electron energy level set in a schematic table in three diagrams:
a) indirect band gap of intrinsic material as silicon
b) the same band model with additional set of electron energy levels due to heavy n-type doping and
c) the same band model with additional set of electron energy levels due to heavy n-type doping and an insertion or grafting of segtons.

FIG. 10 is a schematic illustration of the electron energy band and electron energy level sets of:
a) the intrinsic silicon,
b) the heavily doped n-type strained crystalline nanolayers, denoted <c-Si> which are two at active a-Si/c-Si heterointerfaces and one at the superficial $SiO_2$/Si heterointerface, contain a Si metamaterial,
c) the heavily doped n-type silicon with a specific segton band.

Figure 11:
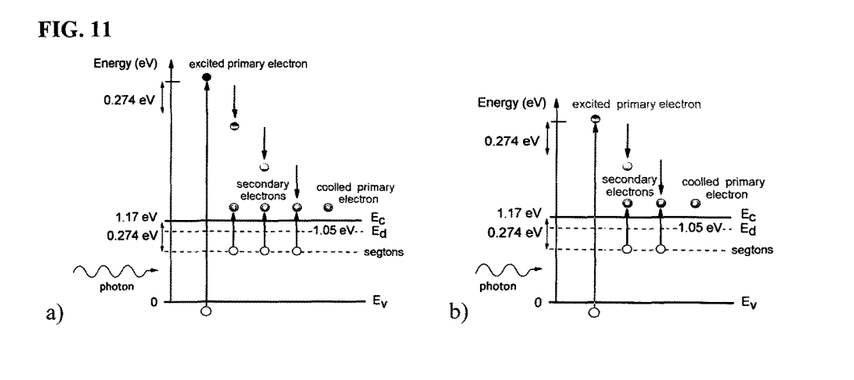
FIG. 11 is a schematic illustration of the electron energy set and of the additional light-to-electricity conversion mechanisms possible due to this set; the low-energy impact ionization of segtons with the photon energy $h\nu>1.1+n\times0,274$ eV, where n which is an integer number represents the multiplication order of:
a) the more energetic photon allowing three (n=3) order multiplications while
b) the less energetic photon allowing two (n=2) order multiplications.

FIG. 11 is a schematic illustration of the electron energy set with an additional light-to-electricity conversion mechanism possible due to this set: low-energy (0.274 eV) impact ionization of segtons with the photon energy >1.1+n×0.274 eV, where n (an integer number) represents the multiplication order with specific energy of 0.274 eV. The electron multiplication concerns:

a) the more energetic photon allowing three order multiplications (n=3) while b) the less energetic photon allowing two (n=2) order multiplications.

Figure 12:
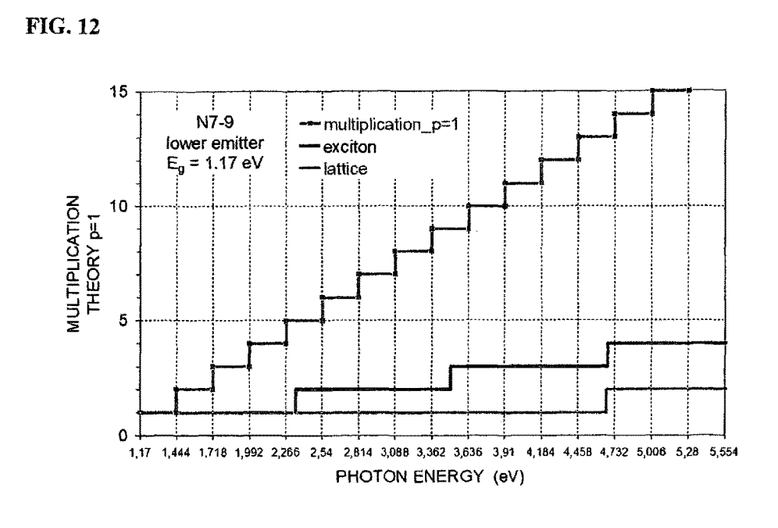
FIG. 12 is a comparison table of stair-like theoretical orders of electron multiplication determined on the basis of three mechanisms:
i) impact ionization of the silicon lattice,
ii) exciton multiplicity with the specific energy corresponding to the silicon band gap and
iii) low-energy impact ionization due to segtons.

FIG. 12 illustrates the comparison of theoretical orders electron multiplication determined on the basis of
  i) the impact ionization of the silicon lattice,
  ii) of the multiexciton with the energy corresponding to the silicon band gap and
  iii) of the low-energy impact ionization due to segtons.

Figure 13A:
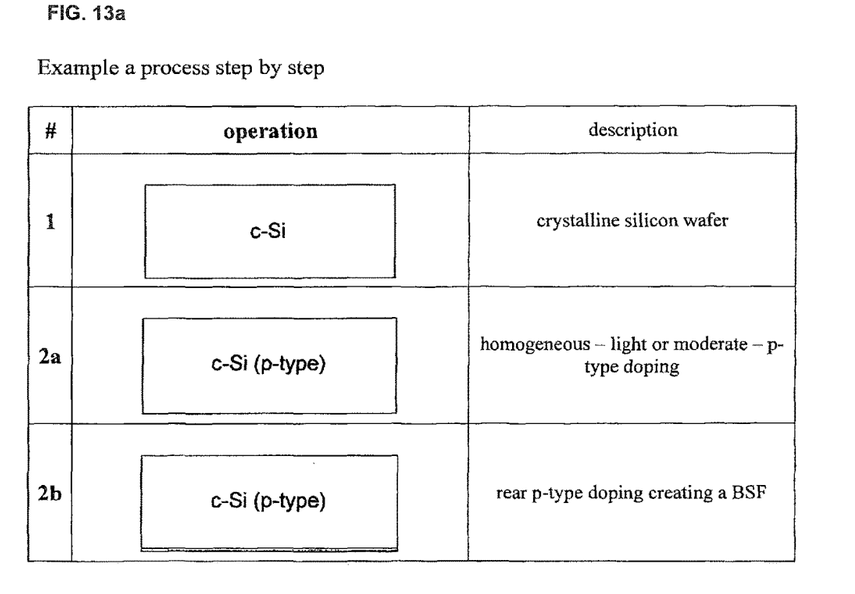
FIGS. 13a-13b are effectivaly flow charts showing the different steps of a process to create segtons grouped within one or several nanolayers forming the seg-matter according to the parallel invention.
Figure 13B:
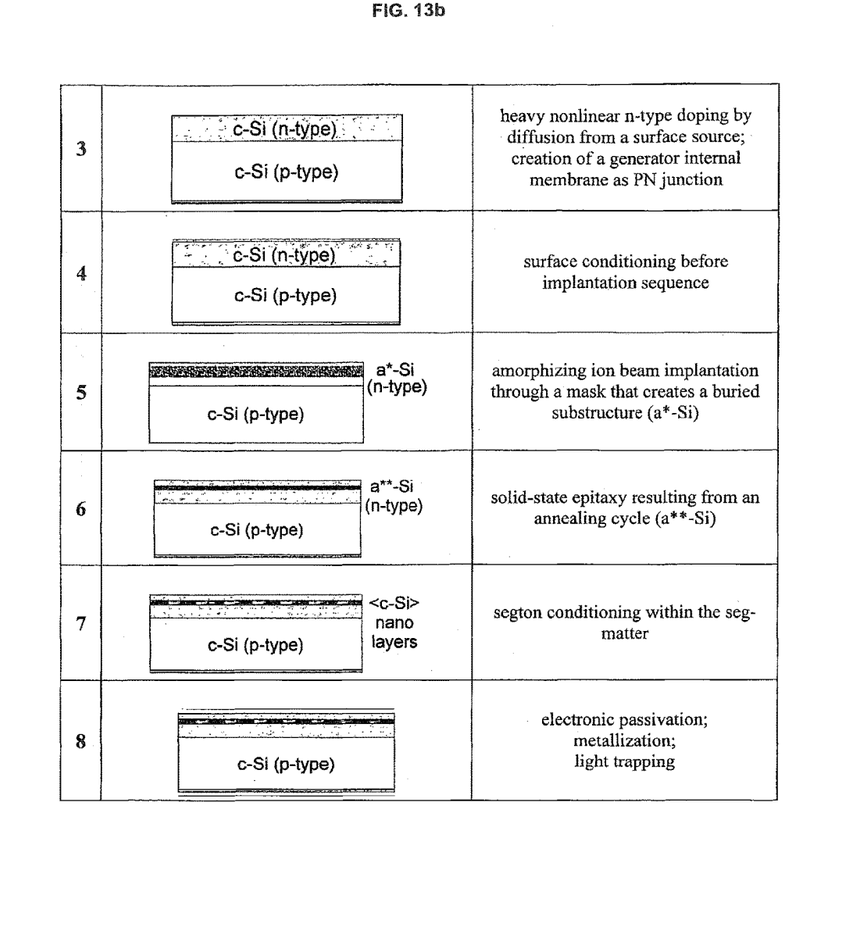

FIG. 13 presents step by step the whole process to create segtons and the grouping of segtons to form one or several nanolayers of segtons.

11. DETAILED EXAMPLE

A detailed example is hereunder with the help of FIG. 13 according to the following steps.

Pre-treatment of a Si wafer with the preferential (100) crystalline orientation and moderate p-type doping (bore)

First operations at the rear face of the converter—additional p-type doping forming a BSF First operations at the front face of the converter—n-type doping by diffusion from a surface doping source to create an emitter and a photogenerator internal membrane such a PN junction Front face conditioning before implantation sequence, etching, masking Buried amorphization through implantation masks with P ions using pre-determined implantation energy and dose, for example from the range between 50 to 100 keV and of about $5\times10^{14}$ ions $cm^{-3}$, Shaping of the buried amorphization with its wrapping <c-Si> nanolayers stuffed with segtons to obtain a metamaterial called sag-matter during a solid state epitaxy annealing cycle Segton conditioning within the sag-matter allowing good distribution, electric charge-state and exposition to the incident photons Final operations: electronic passivation, metallization and light trapping

The invention claimed is:

1. A method for forming and conditioning an elementary lattice structure within a silicon light-to-electricity converter, comprising a silicon crystal-line emitter mass, so as to achieve enhanced light-to-electricity conversion properties when said elementary lattice structure, disposed within said silicon crystalline emitter mass, is illuminated with solar light illumination, comprising the steps of:

providing a doped silicon crystalline emitter mass (c-Si) comprising elementary crystalline silicon units (ECSUs), wherein said elementary crystalline silicon units (ECSUs) comprise a multiplicity of silicon atoms comprising at least silicon atoms a,a',b,b',c,c',d,d';

operatively associating a PN junction with said silicon crystalline emitter mass;

implanting ions at a predetermined depth within said silicon crystalline emitter mass so as to cause an amorphized silicon (a-Si) layer to be formed at a predetermined depth within said crystalline silicon (c-Si) emitter mass so as to thereby form an upper crystalline silicon (c-Si) mass and a lower crystalline silicon (c-Si) mass and a pair of interfaces defined between said amorphized silicon layer and said lower and upper crystalline silicon masses;

removing two of said multiplicity of silicon atoms c,c' from predetermined ones of said elementary crystalline silicon units (ECSUs) originally comprising said at least silicon atoms a,a', b,b', c,c', d,d' of said multiplicity of silicon atoms, wherein said silicon atoms a,a', b,b', c,c', d,d' originally define natural covalent atomic bonds, having first predetermined lengths, between said silicon atoms a,a', b,b', c,c', d,d', comprising a-a', b-b', c-c', and d-d', wherein, however, said removal of said two silicon atoms c,c' from each one of said predetermined elementary crystalline silicon units effectively transforms said crystalline matter disposed inside each one of said elementary crystalline silicon units as a result of the development of a pair of divacancy sites within said predetermined elementary crystalline silicon units such that, as a result of said removal of said two silicon atoms c,c' from said predetermined elementary crystalline silicon units, second new atomic bonds, a-d and d'-a', having lengths greater than said first predetermined lengths characteristic of said natural covalent atomic bonds, as well as a third new atomic bond b-b', having a length greater than said second predetermined lengths of said a-d and d'-a' bonds, are effectively formed through said pair of divacancy sites such that weakly bonded electrons can be released during collisions with warm/hot electrons leading to an electron multiplication cycle comprising additional electron populations;

subjecting said crystalline silicon (c-Si) masses and amorphized silicon (a-Si) layer to annealing temperatures within the range of 500-550° C. which create dilatation forces and a built-in electric field between said amorphized silicon (a-Si) layer and said crystalline silicon (c-Si) masses such that said elementary crystalline silicon units are introduced through interfaces and into transition zones, defined between said crystalline silicon (c-Si) masses and said amorphized silicon (a-Si) layer, from said amorphized silicon (a-Si) layer into said upper and lower crystalline silicon (c-Si) masses and maintained within interface transition zones so as to therefore form upper and lower strained crystalline silicon (<c-Si>) transition zones between said upper and lower crystalline silicon (c-Si) masses and said amorphized silicon (a-Si) layer;

subjecting said elementary crystalline silicon units disposed within said upper and lower strained crystalline silicon (<c-Si>) transition zones to tensile forces resulting from said dilatation forces and said electric field so as to transform said elementary crystalline silicon units into elementary nanoscale units called SEGTONS;

subjecting said SEGTONS to a second annealing step at a temperature of approximately 350° C. in order to activate said SEGTONS; and illuminating said silicon light-to-electricity converter containing said SEGTONS with solar light illumination comprising energetic photons such that absorption of said light illumination generates warm/hot electrons which exhibit high kinetic energy and which collide and interact with said SEGTONS, thereby effectively generating additional electron populations whereby said light-to-electricity conversion properties are significantly improved.

2. The method as set forth in claim 1, wherein:
said implanting of said ions comprises the exclusive implantation of phosphorous ions.

3. The method as set forth in claim 1, wherein:
said predetermined depth at which said amorphized silicon (a-Si) is formed within said crystalline silicon (c-Si) emitter mass is a function of said ion implantation energy.

4. The method as set forth in claim 1, wherein:
said amorphized silicon (a-Si) layer is formed by the use of an ion beam.

5. The method as set forth in claim 1, wherein:
said amorphized silicon (a-Si) layer is formed by the use of an electron beam.

6. The method as set forth in claim 1, wherein:
the number of said elementary crystalline silicon units (ECSUs) comprises at least $10^{20}/cm^3$.

7. The method as set forth in claim 1, further comprising the step of:
forming a nanomembrane between said amorphized silicon (a-Si) layer and each one of said upper and lower strained crystalline silicon (<c-Si>) transition zones as well as between each one of said upper and lower strained crystalline silicon (<c-Si>) transition zones and said upper and lower crystalline silicon (c-Si) masses.

8. The method as set forth in claim 1, wherein:
said ion implantation is accomplished by an ion irradiation beam having a power of 10-200 keV and an ion dose of $10^{14}$ to $10^{16}$ ions/cm$^2$.

9. The method as set forth in claim 1, further comprising the step of:
activating said converter by a final annealing thermal treatment process at a temperature of 350°-450° C.

10. The method as set forth in claim 1, further comprising the step of:
phosphorous doping of said silicon with a density of $10^{18}$ to $10^{20}$ atoms/cm$^3$.

11. The method as set forth in claim 9, further comprising the step of:
prior to said phosphorous doping of said silicon, said silicon is pre-doped with boron.

12. The method as set forth in claim 1, wherein:
said amorphized silicon (a-Si) layer is formed by using implantation masks with phosphorous ions having an energy dose ranging from 50-100 keV and a concentration of ions within the range of $5\times10^{14}$ ions/cm$^3$.

13. The method as set forth in claim 1, further comprising the step of:
self-implanting of silicon (Si) ions into said doped silicon crystalline emitter mass (c-Si).

14. The method as set forth in claim 1, further comprising the step of:
disposing said elementary nanoscale units or SEGTONS into an upper part of said emitter of said converter so as to be optimally subjected to said solar light illumination and released from said lattice when said converter is illuminated with solar light illumination.

15. The method as set forth in claim 1, wherein:
said doped silicon crystalline emitter mass (c-Si) comprising said elementary crystalline silicon units (ECSUs) comprises a heavily doped N-type semiconductor environment.

16. The method as set forth in claim 1, wherein:
said annealing of said crystalline silicon (c-Si) masses and said amorphized silicon (a-Si) layer to temperatures within the range of 500-550° C. results in the wrap-ping of amorphized silicon grains within nanolayers which have thickness dimensions of 3-10 nm.

17. The method as set forth in claim 1, wherein:
said silicon light-to-electricity converter comprises a photo-voltaic cell.

18. An elementary lattice structure within a silicon light-to-electricity converter, comprising a silicon crystalline emitter mass, so as to achieve enhanced light-to-electricity conversion properties when said elementary lattice structure, disposed within said silicon crystalline emitter mass, is illuminated with solar light illumination, made by the process comprising the steps of:
providing a doped silicon crystalline emitter mass (c-Si) comprising elementary crystalline silicon units (ECSUs), wherein said elementary crystalline silicon units (ECSUs) comprise a multiplicity of silicon atoms comprising at least silicon atoms a,a',b,b',c,c',d,d';
operatively associating a PN junction with said silicon crystalline emitter mass;
implanting ions at a predetermined depth within said silicon crystalline emitter mass so as to cause an amorphized silicon (a-Si) layer to be formed at a predetermined depth within said crystalline silicon (c-Si) emitter mass so as to thereby form an upper crystalline silicon (c-Si) mass and a lower crystalline silicon (c-Si) mass and a pair of interfaces defined between said amorphized silicon layer and said lower and upper crystalline silicon masses;
removing two of said multiplicity of silicon atoms c,c' from predetermined ones of said elementary crystalline silicon units (ECSUs) originally comprising said at least silicon atoms a,a', b,b', c,c', d,d' of said multiplicity of silicon atoms, wherein said silicon atoms a,a', b,b', c,c', d,d' originally define natural covalent atomic bonds, having first predetermined lengths, between said silicon atoms a,a', b,b', c,c', d,d', comprising a-a', b-b', c-c', and d-d', wherein, however, said removal of said two silicon atoms c,c' from each one of said predetermined elementary crystalline silicon units effectively transforms said crystalline matter disposed inside each one of said elementary crystal-line silicon' units as a result of the development of a pair of divacancy sites within said predetermined elementary crystalline silicon units such that, as a result of said removal of said two silicon atoms c,c' from said predetermined elementary crystalline silicon units, second new atomic bonds, a-d and d'-a', having lengths greater than said first predetermined lengths characteristic of said natural covalent atomic bonds, as well as a third new atomic bond b-b', having a length greater than said second predetermined lengths of said a-d and d'-a' bonds, are effectively formed through said pair of divacancy sites such that weakly bonded electrons can be released during collisions with warm/hot electrons leading to an electron multiplication cycle comprising additional electron populations;
subjecting said crystalline silicon (c-Si) masses and amorphized silicon (a-Si) layer to annealing temperatures within the range of 500-550° C. which create dilatation forces and a built-in electric field between said amorphized silicon (a-Si) layer and said crystalline silicon (c-Si) masses such that said elementary crystalline silicon units are introduced through interfaces and, into transition zones, defined between said crystalline silicon (c-Si) masses and said amorphized silicon (a-Si) layer, from said amorphized silicon (a-Si) layer into said upper and lower crystalline silicon (c-Si) masses and maintained within interface transition zones so as to therefore form upper and lower strained crystalline silicon (<c-Si>) transition zones between said upper and lower-crystalline silicon (c-Si) masses and said amorphized silicon (a-Si) layer;

subjecting said elementary crystalline silicon units disposed within said upper and lower strained crystalline silicon (<c-Si>) transition zones to tensile forces resulting from said dilatation forces and said electric field so as to transform said elementary crystalline silicon units into elementary nanoscale units called SEGTONS;

subjecting said SEGTONS to a second annealing step at a temperature of approximately 350° C. in order to activate said SEGTONS; and illuminating said silicon light-to-electricity converter containing said SEGTONS with solar light illumination comprising energetic photons such that absorption of said solar light illumination generates warm/hot electrons which exhibit high kinetic energy and which collide and interact with said SEGTONS, therby effectively generating additional electron populations whereby said light-to-electricity conversion properties are significantly improved.

19. The structure as set forth in claim 18, wherein:
said implanting of said ions comprises the exclusive implantation of phosphorous ions.

20. The structure as set forth in claim 18, wherein:
said predetermined depth at which said amorphized silicon (a-Si) is formed within said crystalline silicon (c-Si) emitter mass is a function of said ion implantation energy.

21. The structure as set forth in claim 18, wherein:
said amorphized silicon (a-Si) layer is formed by the use of an ion beam.

22. The structure as set forth in claim 18, wherein:
said amorphized silicon (a-Si) layer is formed by the use of an electron beam.

23. The structure as set forth in claim 18, wherein:
the number of said elementary crystalline silicon units (ECSUs) comprises at least $10^{20}/cm^3$.

24. The structure as set forth in claim 18, further comprising the step of:
forming a nanomembrane between said amorphized silicon (a-SI) layer and each one of said upper and lower strained crystalline silicon (<c-Si>) transition zones as well as between each one of said upper and lower strained crystalline silicon (<c-Si>) transition zones and said upper and lower crystalline silicon (c-Si) masses.

25. The structure as set forth in claim 18, wherein:
said ion implantation is accomplished by an ion irradiation beam having a power of 10-200 keV and an ion dose of $10^{14}$ to $10^{16}$ ions/cm$^2$.

26. The structure as set forth in claim 18, further comprising the step of:
activating said converter by a final annealing thermal treatment process at a temperature of 350°-450° C.

27. The structure as set forth in claim 18, further comprising the step of:
phosphorous doping of said silicon with a density of $10^{18}$ to $10^{20}$ atoms/cm$^3$.

28. The structure as set forth in claim 27, further comprising the step of:
prior to said phosphorous doping of said silicon, said silicon is pre-doped with boron.

29. The structure as set forth in claim 18, wherein:
said amorphized silicon (a-Si) layer is formed by using implantation masks with phosphorous ions having an energy dose ranging from 50-100 keV and a concentration of ions within the range of $5 \times 10^{14}$ ions/cm$^3$.

30. The structure as set forth in claim 18, further comprising the step of:
self-implanting of silicon (Si) ions into said doped silicon crystalline emitter mass (c-Si).

31. The structure as set forth in claim 18, further comprising the step of:
disposing said elementary nanoscale units or SEGTONS into an upper part of said emitter of said converter so as to be optimally subjected to said solar light illumination and released from said lattice when said converter is illuminated with solar light illumination.

32. The structure as set forth in claim 18, wherein:
said doped silicon crystalline emitter mass (c-Si) comprising said elementary crystalline silicon units (EC-SUs) comprises a heavily doped N-type semiconductor environment.

33. The structure as set forth in claim 18, wherein:
said annealing of said crystalline silicon (c-SI) masses and said amorphized silicon (a-Si) layer to temperatures within the range of 500-550° C. results in the wrap-ping of amorphized silicon grains within nanolayers which have thickness dimensions of 3-10 nm.

34. The structure as set forth in claim 18, wherein:
said silicon light-to-electricity converter comprises a photovoltaic cell.

* * * * *